United States Patent [19]
Johnson

[11] Patent Number: 5,784,320
[45] Date of Patent: Jul. 21, 1998

[54] METHOD AND APPARATUS FOR REDUCING POWER CONSUMPTION IN A MEMORY BY EMPLOYING A CONDITIONAL WRITE CONTROLLER

[75] Inventor: Luke A. Johnson, Tempe, Ariz.

[73] Assignee: Intel Corporation, Santa Clara, Calif.

[21] Appl. No.: 721,674

[22] Filed: Sep. 27, 1996

[51] Int. Cl.$^6$ .............................. G11C 16/04; G11C 7/00
[52] U.S. Cl. ................. 365/189.01; 365/189.07; 365/203
[58] Field of Search ............... 365/189.01, 189.07, 365/203

[56] References Cited

U.S. PATENT DOCUMENTS

| | | | |
|---|---|---|---|
| 4,811,294 | 3/1989 | Kobayashi et al. | 365/189.07 |
| 4,907,189 | 3/1990 | Branson et al. | 365/189.07 |
| 5,197,026 | 3/1993 | Butler | 365/189.07 |
| 5,287,326 | 2/1994 | Hirata | 365/189.07 |
| 5,497,347 | 3/1996 | Feng | 365/189.07 |

*Primary Examiner*—David C. Nelms
*Assistant Examiner*—Trong Phan
*Attorney, Agent, or Firm*—Blakely, Sokoloff, Taylor & Zafman

[57] ABSTRACT

A write control unit, coupled to a memory cell, for controlling write operations to the memory cell is disclosed. The write control unit includes a write qualification unit that qualifies the write operation. The write qualification unit includes a first input for receiving a first data signal that indicates a current data value of the memory cell. The write qualification unit also includes a second input for receiving a second data signal that indicates a data value to be written to the memory cell. The write qualification unit enables a write operation to the memory cell only if the first data signal is different from the second data signal (i.e., the first data value and the second data value are different). If the first data value and the second data value are the same, the write qualification unit suppresses the write operation.

12 Claims, 6 Drawing Sheets

METHOD AND APPARATUS FOR REDUCING POWER CONSUMPTION IN A MEMORY BY EMPLOYING A CONDITIONAL WRITE CONTROLLER

BACKGROUND OF THE INVENTION

1. Field of the Invention

The present invention relates generally to an improved cache controller and specifically to a method and apparatus for reducing power consumption in a memory by employing a conditional write controller.

2. Description of the Related Art

As consumers demand a greater number of portable devices of ever-increasing complexity, circuit designers are forced to address power considerations in circuit design while maintaining performance of the electronic circuits. One such area of circuit design involves semiconductor memories and memory controllers.

Typically, in order to write data to a memory cell, it is necessary to drive the associated bitline(s) to the full voltage swing (i.e., the power supply voltage of the system). It is apparent that driving the bitline to the power supply voltage and thereafter driving the same bitline to its operating voltage consumes power.

In order to conserve power during a write operation, circuit designers typically cannot employ the same power saving techniques employed during a read operation because those techniques involve limiting the voltage swing on the bitlines. For example, during a read operation by not driving the bitlines across the full voltage range, the performance of a circuit is enhanced, and the power consumption of the circuit is reduced. However, such a technique cannot be employed during a write operation because it is important to drive the bitlines, associated with a memory cell to which a write operation is directed, to the full voltage range in order to insure that data is correctly written to that memory cell.

Accordingly, there is a need for a method and apparatus for reducing the power consumption during a write operation that concomitantly maintains the performance of the memory circuit.

SUMMARY OF THE INVENTION

A write control unit that controls the write operation to a memory cell in a memory array is disclosed. The write control unit includes a write qualification unit that has a first input for receiving a first data signal that indicates the current value of that memory cell. The write qualification unit also includes a second input for receiving a second data signal that indicates a data value to be written to the memory cell. The write control unit of the present invention performs a conditional write to the memory cell only if the write qualification unit determines that the first data signal is different from the second data signal (i.e., the data to be written is different than the data that is currently in the memory cell). If the first data signal is equal to the second data signal (i.e., the data currently in the memory cell is equal to the data value to be written to the memory cell), the write qualification unit of the present invention suppresses the write operation. Otherwise, the write qualification unit enables the write operation and the write control unit writes the second data signal to the memory cell. The write qualification unit of the present invention may also include a third input for receiving a signal that indicates a write operation is desired by a computer system.

BRIEF DESCRIPTION OF THE DRAWINGS

The objects, features and advantages of the method and apparatus for the present invention will be apparent from the following description in which.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

Figure 1:
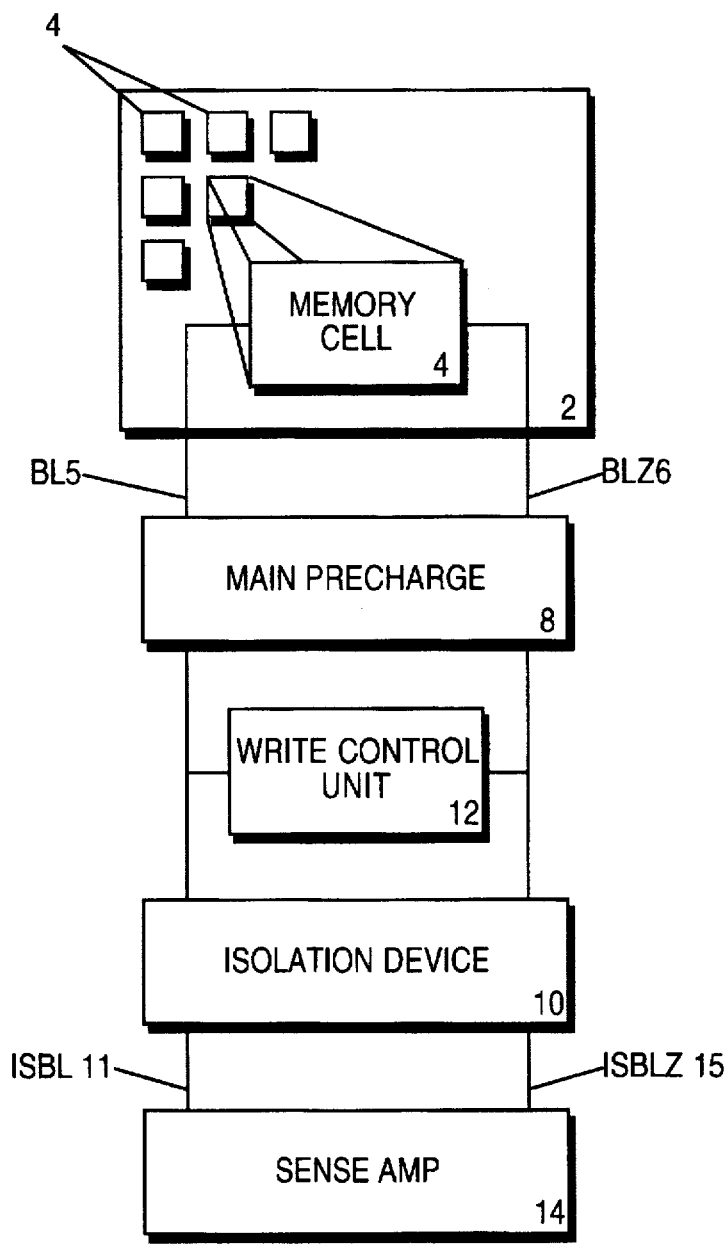
FIG. 1 illustrates a memory system in which the present invention may be implemented.

FIG. 1 illustrates a memory system in which the present invention may be implemented. This memory system includes a memory array 2 (e.g., a Random Access Memory (RAM)) that includes a plurality of cells 4. Each cell 4 has associated with it two complementary bit lines (i.e., a BL bitline 5 and a BLZ bitline 6). This memory system includes a main precharge unit 8 for charging bitlines BL 5 and BLZ 6 to a predetermined voltage (e.g., Vcc=3.3 volts). The memory system also includes an isolation unit 10 for isolating the RAM array 2, main precharge 8, and write control unit 12 from sense amplifier 14, which will be described in greater detail hereinafter.

Specifically, the isolation unit 10 isolates complementary bitlines BL 5 and BLZ 6 from bitline ISBL 11 and bitline ISBLZ 15, respectively. The prefix IS is used to indicate that these bitlines, ISBL 11 and ISBLZ 15, are isolated from the BL 5 and BLZ 6 bitlines when the isolation unit 10 is enabled. Power consumption is reduced during a read from the memory array 2 by minimizing the voltage swing on the bitlines (5 and 6). The voltage swing on the bitlines 5 and 6 is minimized through the use of the isolation device 10. The sense amplifier 14 is employed to detect slight voltage variations between bitline ISBL 11 and bitline ISBLZ 15 and to convert these slight differential voltages into a logic high or a logic low (i.e., a predetermined voltage level corresponding to either a logic 1 or logic 0).

Figure 2:
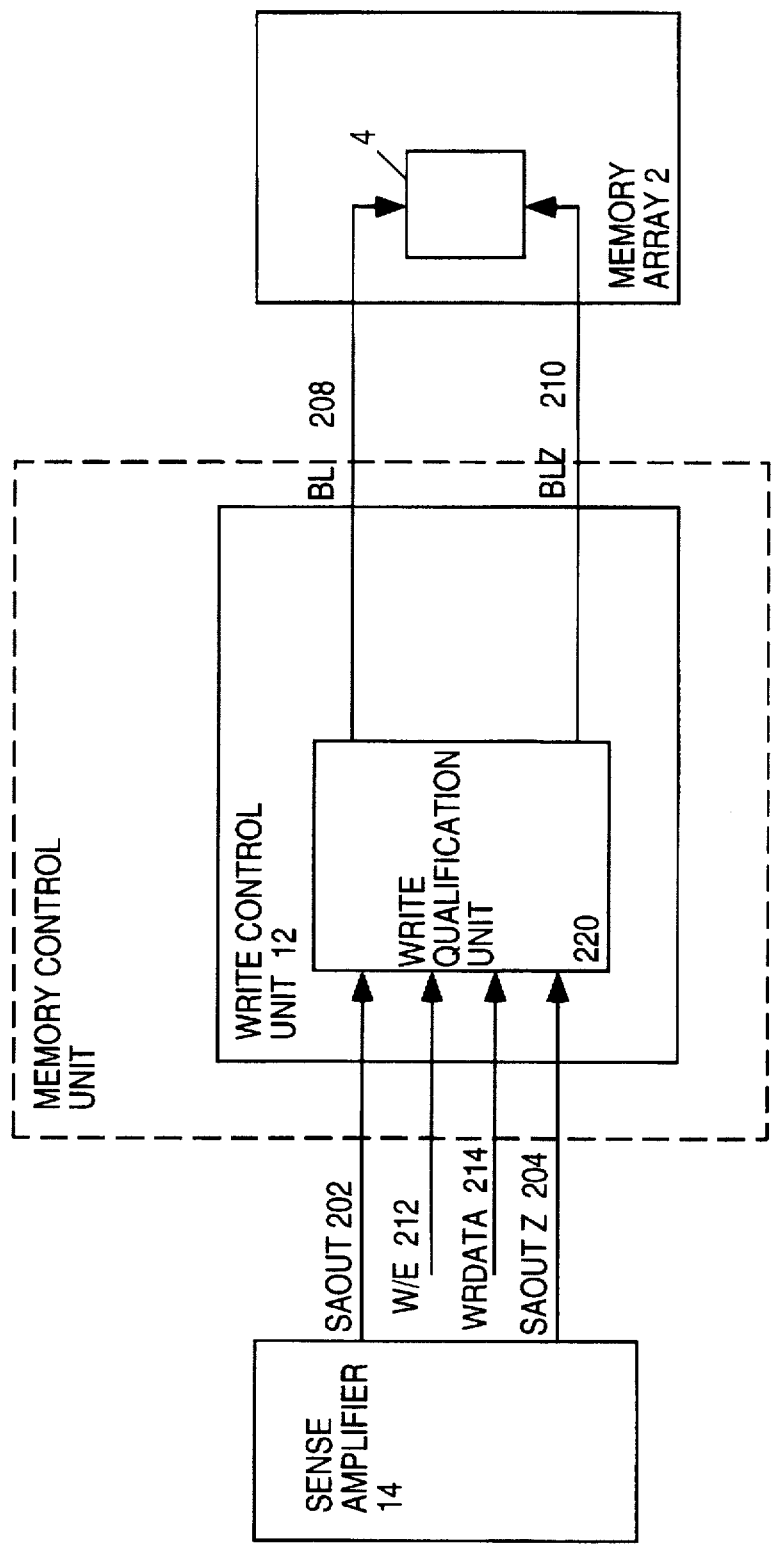
FIG. 2 is a block diagram illustrating in greater detail the write control unit of the present invention.

FIG. 2 illustrates a block diagram of the write control unit 12 of the present invention. A memory controller (e.g., a cache controller) includes a write control unit 12 that manages updates to a memory (e.g., cache tags). The write control unit 12 includes a write qualification unit 220 that has a first input for receiving a bitline having a SAOUT signal 202, and a second input for receiving a complementary bitline having a SAOUTZ signal 204. The write qualification unit 220 further includes third input for receiving a write enable (W/E) signal 212 that indicates a write operation is desired, and a fourth input for receiving data 214 (WRDATA) (a logic 1 or 0) that is to be written to a particular cell in the memory array. The write control unit 12 includes an output coupled to bitline BL 208 and a second output coupled to a bitline BLZ 210 (BL and BLZ were referred to in FIG. 1 by numerals 5 and 6). When BL 208 is driven low, a logic 0 is written to the memory cell, whereas if BLZ 210 is driven low, a logic 1 is written to the particular cell in the memory array 2. The write control unit 12 of the present invention is interposed between the sense amplifier 14 and the memory array 2.

In this embodiment, the write control unit 12 includes a compare unit 220 (hereinafter also referred to as a write qualification unit) that 1) compares the SAOUT signal 202 with the WRDATA data 214, 2) compares the SAOUTZ signal 204 with the WRDATA data 214, and 3) based on these comparisons, and the state of the write enable signal 212, selectively performs a write operation (either a logic "1" or "0") or suppresses the write operation. In other words, the write control unit 12 1) drives BL 208 low and BLZ 210 high, 2) drives BLZ 210 low and BL 208 high, or 3) drives neither BL 208 nor BLZ 210 to any value (i.e., suppress the write operation). The details of the write qualification unit 220 will be described in greater detail hereinafter with reference to FIG. 5.

Figure 3:
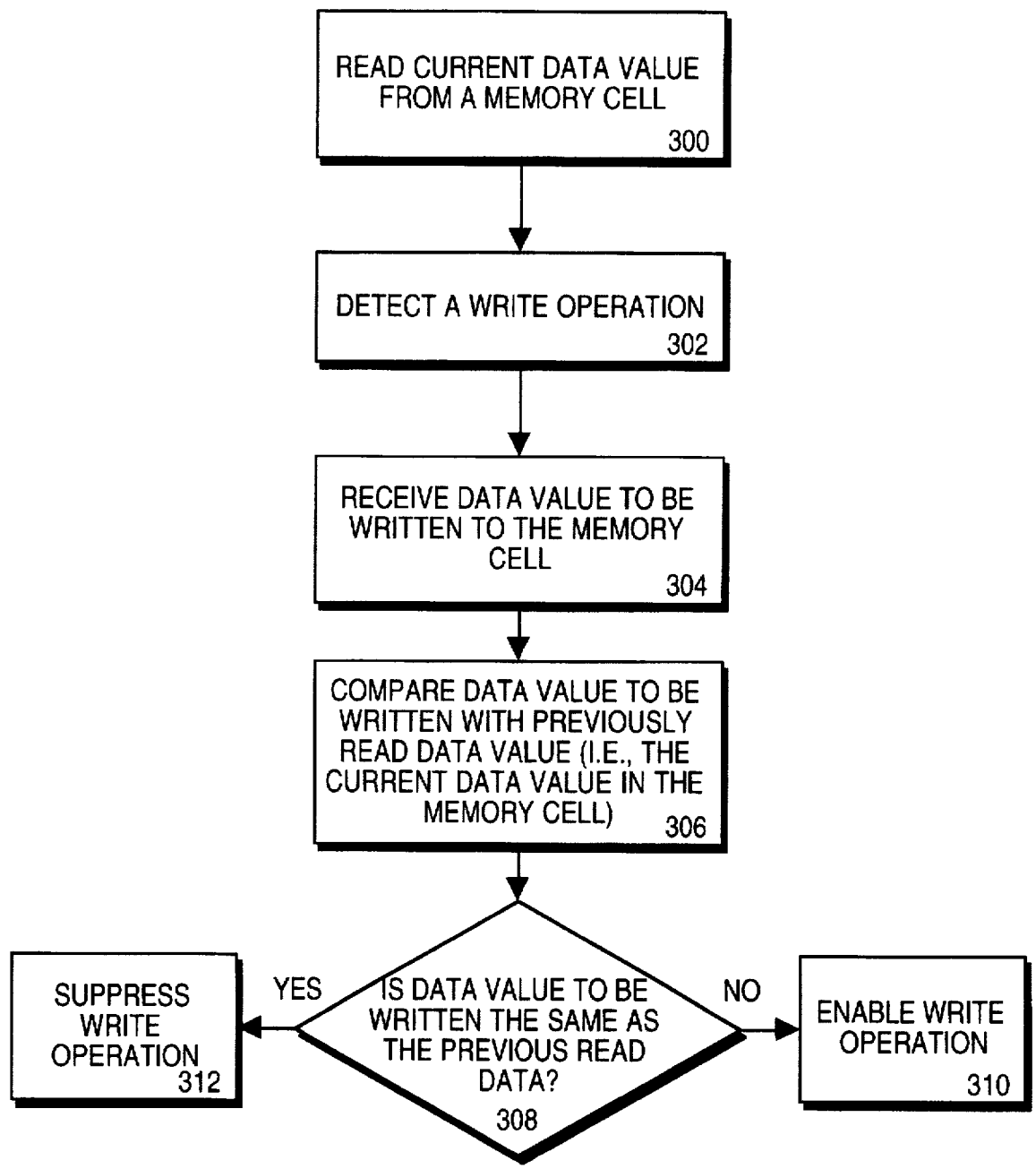
FIG. 3 is a flowchart illustrating the steps performed by one embodiment of the present invention in writing to a memory array in accordance with the teachings of the present invention.

FIG. 3 is a flowchart illustrating the processing steps of one embodiment of the present invention. In step 300, a bit (i.e., a memory cell) is read from a memory array (e.g., a tag array) (i.e., reading the current data value of a cell in the memory array). In step 302, the present invention detects a write operation (by checking the write enable signal). In step 304, data to be written to the memory cell is received. In step 306, the value of the cell previously read is compared to the received data that is to be written to that particular cell. In step 308, a determination is made whether or not the data to be written to that cell is equal to the value already in the cell. If yes, in step 312, the present invention suppresses the write operation for that memory cell (i.e., no operation is performed). If no, in step 310, the present invention enables the write operation to be performed on the memory cell.

Figure 4:
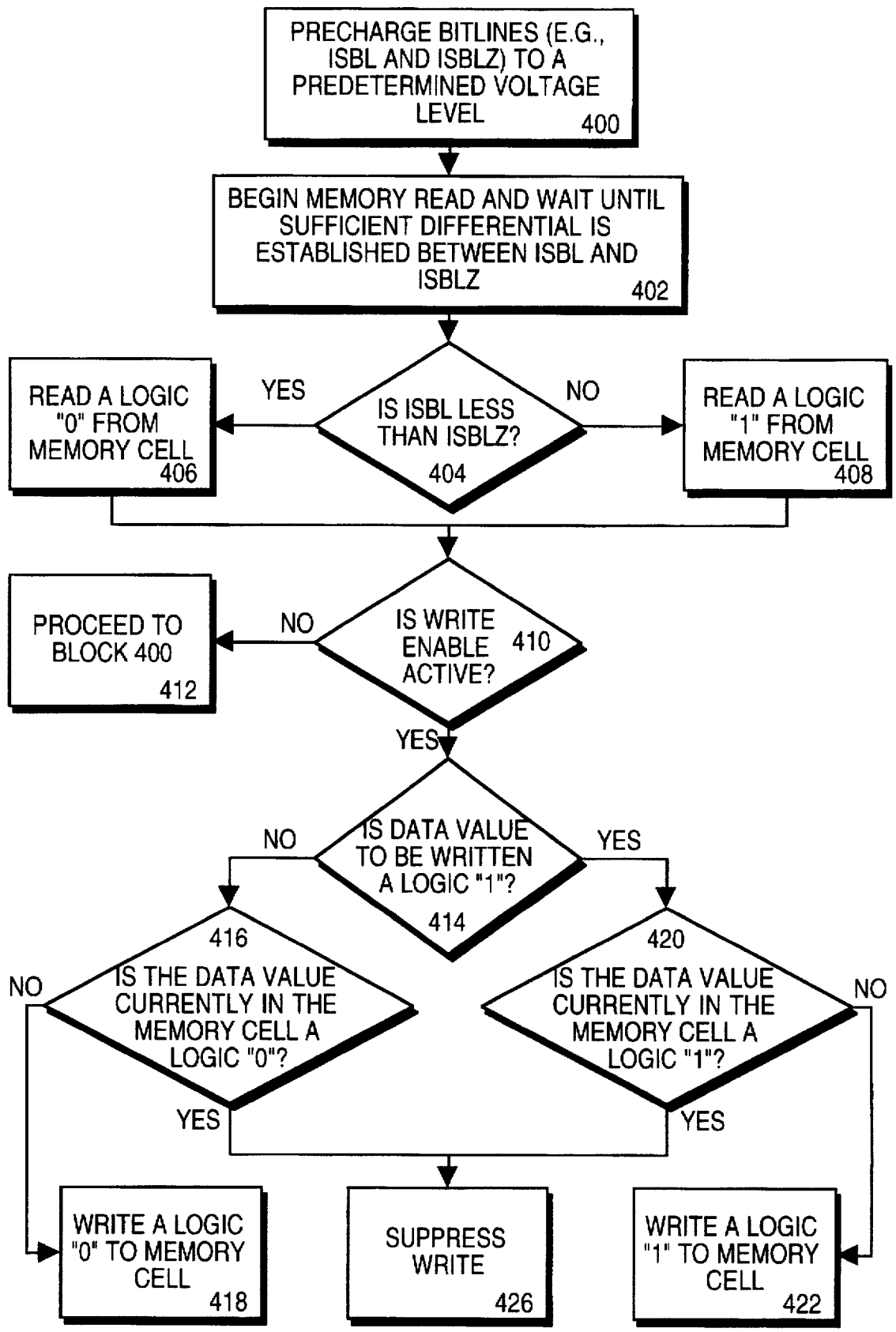
FIG. 4 is a flowchart illustrating the steps performed by an alternative embodiment of the present invention in writing to a memory array in accordance with the teachings of the present invention.

FIG. 4 is a flowchart illustrating the steps of a read operation and write operation on a memory cell array employing the teachings of an alternative embodiment of the present invention.

In step 400, the main precharge unit 8 precharges the bitlines 6 (i.e., BL and BLZ) to a first predetermined voltage (e.g., Vcc=3.3 volts). The isolation unit 10 at this point is not enabled, and so the bitlines 11 and 15 reflect the precharged voltage values of bitlines 5 and 6. In step 402, the sense amplifier 14 begins a memory read operation on the memory 4 cell (e.g., a Random Access Memory (RAM) cell) and waits until a sufficient differential voltage is established between the bitlines (BL and BLZ). Once this differential voltage is detected, the isolation unit 10 is enabled, and the memory array 2 is isolated from the sense amplifier 14.

In decision block 404, sense amplifier 14 determines whether or not ISBL is less than ISBLZ. If yes, a logic "0" is read from the memory cell (i.e., the sense amplifier 14 drives the ISBL bitline 15 to a predetermined voltage corresponding to a logic 0 and drives the ISBLZ bitline 11 to a predetermined voltage corresponding to a logic "1"). If no, in step 410, a logic "1" is read from the memory cell (i.e., the sense amplifier drives the ISBL bitline 11 to a predetermined voltage level corresponding to a logic 1 and drives ISBLZ to a predetermined voltage corresponding to a logic "0").

By isolating the memory array 2 from the sense amplifier 14, during a read operation, although either ISBL or ISBLZ 11 is driven to a ground potential, the bitlines 6 (BL and BLZ) remain at a voltage potential relatively close to Vcc (i.e., one of the bitlines is at approximately Vcc, and the other bitline is approximately at 0.1 V–0.3 V below Vcc). By so doing, this design technique conserves power consumption since the bitlines BL and BLZ, need only be charged approximately 0.1 V to 0.3 V to reach the predetermined precharge value of Vcc instead of from a ground potential to Vcc. Moreover, less power is required to drive either ISBL or ISBLZ 11 to ground potential than BL and BLZ 6 to ground potential because the memory array has more capacitance.

In step 410, a determination is made whether or not the write enable signal is active. If the write enable signal is not active, the processing proceeds to step 400. If the write enable signal is active, a further determination (decision block 414) is made whether the data value to be written to the memory cell (i.e., the second data value) is a logic "1". If no, a further determination is made in decision block 416 whether the data value currently in the memory cell (i.e., the first data signal) is a logic "0". If the first data signal is the same as the second data signal, then the write operation is suppressed (step 426). If the second data signal is different from the first data signal, the write control unit of the present invention writes a logic "0" to the memory cell (processing step 418).

If the determination in decision block 414 is yes, a further determination is made as to whether the data value currently in the memory cell (i.e., the second data value) is a logic "1" (decision block 420). If yes (i.e., the second data signal is equal to the first data signal), the write operation is suppressed by the write controller (processing step 426). Otherwise, (i.e., the second data signal is different from the first data signal), the write control unit writes a logic "1" to the memory cell (step 422).

Although this embodiment of the present invention is described for a memory cell having two complementary bitlines and an associated differential sense amplifier, it will be understood by those skilled in the art, that the teachings of the present invention may be applied to a memory cell having a single bitline, and a memory system employing a single ended sense amplifier.

Figure 5:
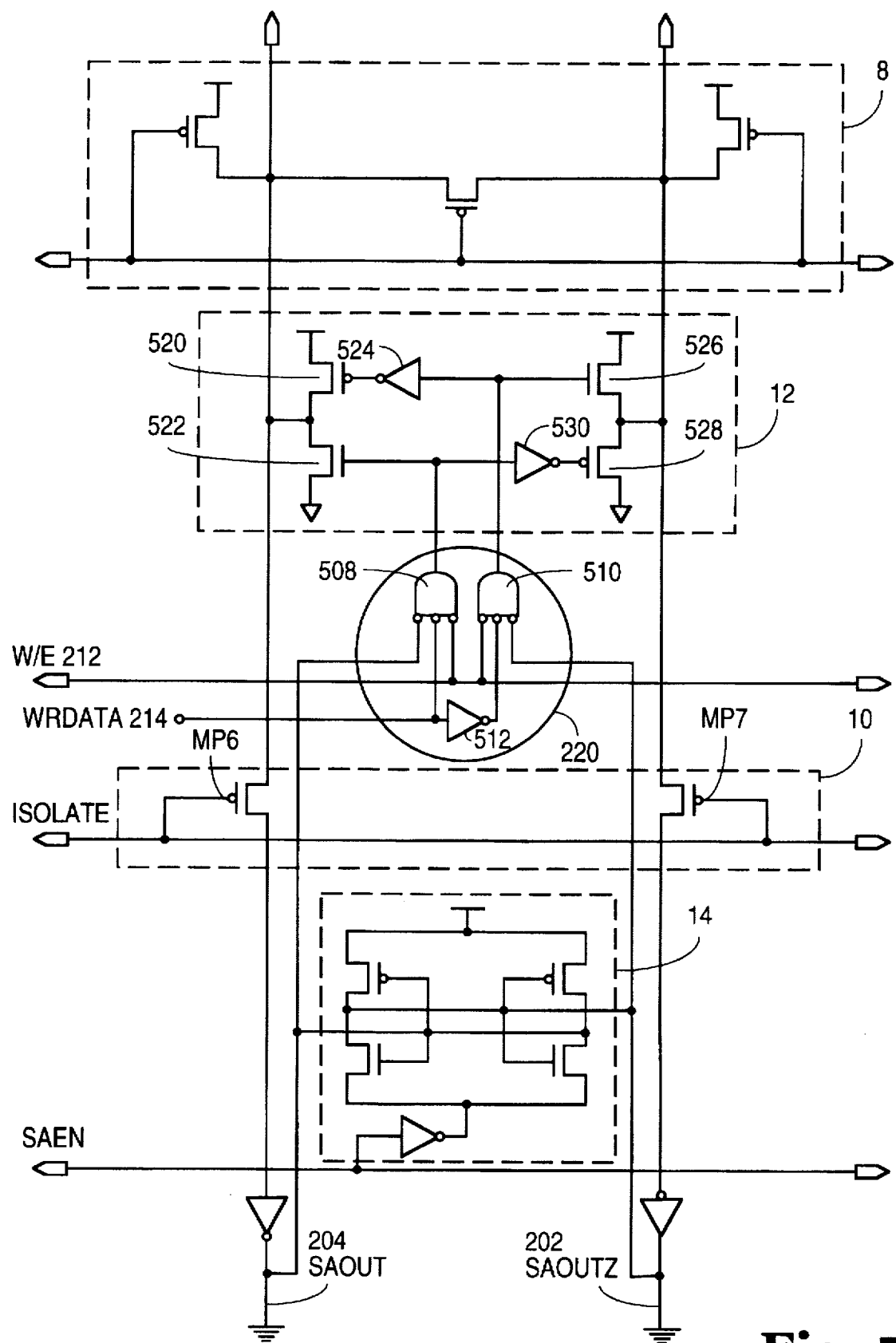
FIG. 5 illustrates a circuit diagram of one embodiment of the memory system illustrated in FIG. 1.

FIG. 5 illustrates a circuit diagram for one embodiment of the memory system illustrated in FIG. 1 with the omission of the memory 4. Specifically, FIG. 5 illustrates a circuit diagram illustrating how each of the blocks of FIG. 1 may be implemented by employing transistors.

The main sense amplifier precharge unit 8 is implemented with PMOS transistors so that bitlines BL and BLZ always start from a known value that is Vcc (e.g., approximately 3.3 V).

The write control unit 12 includes a write qualification unit 220 that qualifies a write operation with previously read data. The write qualification unit 220 includes a first input for receiving the write enable signal (i.e., the W/E signal 212), a second input for receiving the data to be written (i.e., the WRDAT signal 214) and a third input for receiving the data currently in the memory cell (i.e., the SAOUT 202 and SAOUTZ 204 signals). The SAOUT and SAOUTZ signals 202, 204 qualify the write to the memory cell and thereby conserve power when the data value currently in the memory cell is the same as the WRDAT 214 (i.e., when the write operation is suppressed). The write qualification unit 220 may be implemented by employing a first NOR gate 508, a second NOR gate 510 and a first inverter 512, as shown. As noted previously, the qualification unit 220 further qualifies the write operation indicated by the write enable signal 212, by comparing the data to be written to the memory (WRDATA 214) with the data that currently resides in the memory (i.e., the SAOUT and SAOUTZ signals 202, 204).

The write control unit 12 further includes driver circuits (transistors and inverters) to selectively drive the bitlines BL and BLZ to predetermined voltage so as to effect the writing of a data value (either a logic "1" or logic "0") to the memory cell. When BLZ is driven high and BL is driven to a logic low, a logic zero is written in the memory cell. Similarly, if the bitline BLZ is driven low and BL is driven to a logic high, a logic high is written to the memory cell. Specifically, a first transistor 520, a second transistor 522 and a second inverter 524 are employed to drive bitline BL. A third transistor 526, a fourth transistor 528 and a third inverter 530 are employed to drive bitline BLZ.

The isolation device 10 may be implemented with 2 PMOS devices (MP6 and MP7). An isolate signal is provided to the isolation device 10. The isolation devices are deasserted high one gate delay after the sense amplifier 14 is enabled. The isolation device 10 is asserted low one gate delay after the sense amplifier 14 is disabled.

The sense amplifier 14 is enabled once there is approximately 250 millivolt differential on the bitlines BL and BLZ. A SAEN signal is provided to enable the sense amplifier 14. Once enabled, the sense amplifier 14 drives ISBL and ISBLZ completely to proper logical values (i.e., logic "1" or logic "0") depending on whether BL is greater than BLZ or BLZ is greater than BL.

Figure 6:
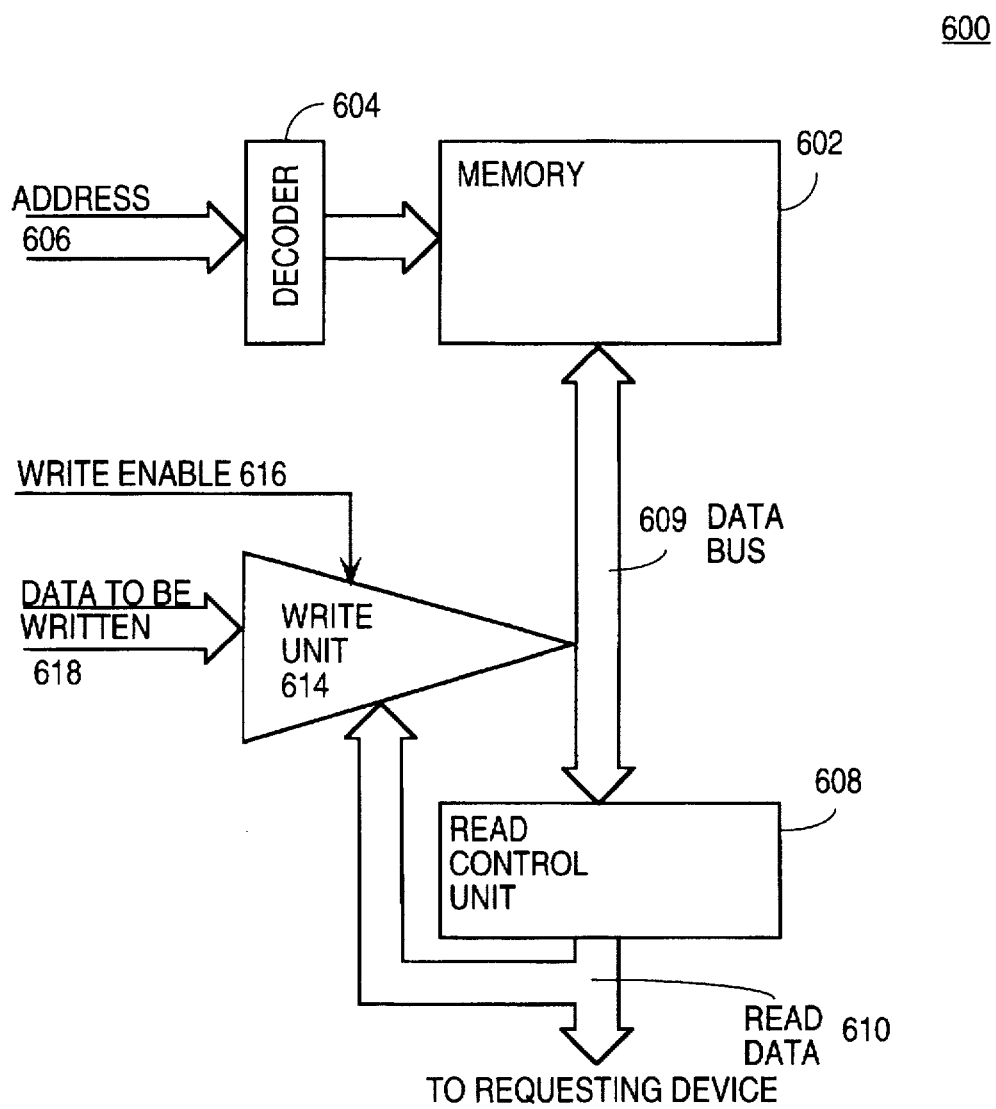
FIG. 6 illustrates a memory system in which the present invention may be implemented.

FIG. 6 illustrates a memory system 600 in which the present invention may be implemented. The memory system 600 includes a memory 602 coupled to an address decoder 604. Address decoder 604 receives addresses 606 and decodes them to provide access to the memory 602. A read control unit 608 controls read accesses to memory 602. During a read cycle, data at a memory location specified by address 606 is provided to the read control unit 608 via data bus 609. The read data 610 is subsequently provided to a requesting device (not shown). For example, this requesting device may be a microprocessor, or a cache tag compare block.

The memory system 600 includes a write unit 614 having a first input for receiving a write enable signal 616, a second input for receiving data to be written 618, and a third input for receiving the read data 610. The present invention, as embodied in the write unit 614, selectively drives the data to be written 618 to the data bus 609, that subsequently provides the data 618 to memory 602. If the write enable signal 616 is asserted, and the read data 610 is different from the data to be written 618, then the write unit 614 drives the data to be written 618 to the data bus 609. In other words, the result of a comparison between the read data 610 and the data to be written 618 qualifies the write enable signal 616. This comparison and qualification are performed on a bit by bit basis so that all, some or none of the bits of a multiple bit data word may be written.

When the memory 602 is a cache tag, the read unit 608 is coupled to a hit-determination unit (not shown) that compares the read data 610 with the address 606 (or selected bits of address 606). When the address 606 does not match any of the tags in the tag array, there is a miss. When a tag miss occurs, a row is allocated in the tag array and one of the tags is updated to a new value (i.e., a new tag corresponding to the previously missed addressed). The write unit 614 employs the previously read information 610 (concerning the tag that missed) to qualify a write (i.e., an update to the tag) on a bit-per-bit basis. Specifically, if a particular bit in the tag is already a correct value, the present invention does not re-write that bit into the memory cell (e.g., RAM cell). The present invention capitalizes on the fact that during cache access, the tag array is always read first to determine if the data requested resides in the data array portion of the cache.

In summary, the present invention performs a bitwise conditional write which greatly reduces power consumption in a memory system. The present invention is also conveniently implemented without substantially increasing the complexity or size of the layout of the semiconductor chip in which a memory system may be implemented. Since the read and write circuitry are typically implemented close together (e.g., inside a sense amplifier), the present invention may be implemented with minimal layout changes and extra area.

When implemented in a cache system, assuming that a cache tag receives random addresses, one would expect the power saving technique of the present invention to improve the write power consumption by fifty percent on the average. However, the actual saving may actually be much greater than fifty percent since most software code exists in a subset of the entire N-bit (e.g., N=32) address space. For example, the most significant bits are typically never written to. For example, if application code is twice the size of a cache, then as few as one bit in an address would require a change on a miss of the cache since only a few bits differ between adjacent addresses.

It should be noted that many cache architectures read the cache data array simultaneously with the tag array prior to writing. Hence, these architectures can employ this conditional write technique to the data array as well as the tag array.

In the foregoing specification, the invention has been described with reference to specific exemplary embodiments thereof. It will however be evident that various modifications and changes may be made thereto without departing from the broader spirit and scope of the invention as set forth in the appended claims. The specification and drawings are accordingly to be regarded as illustrative rather than restrictive.

What is claimed is:

1. A write qualification unit, coupled to a memory cell, said write qualification unit comprising:

a) a first input for receiving a first data signal, said first data signal indicating a current data value in said memory cell;

b) a second input for receiving a second data signal, said second data signal indicating a data value to be written to said memory cell;

c) said write qualification unit for performing a bit-wise conditional write operation of said second data signal to said memory cell if said first data signal and said second data signal are in a predetermined logical relationship.

2. The write qualification unit of claim 1, wherein the write qualification unit further includes a comparator, said comparator receiving said first data signal and said second data signal, comparing said first and second data signal, and generating a signal, said signal indicating the result of said comparison;

wherein said write qualification unit performs a bit-wise conditional write operation if the signal is asserted.

3. The write qualification unit of claim 1, wherein said write qualification unit further includes a third input for receiving a write enable signal, said write enable signal being asserted when a write operation is desired, wherein the occurrence of a write operation is further conditioned on whether or not said write enable signal is active.

4. The write qualification unit of claim 1, wherein the write qualification unit further includes a comparator, said comparator receiving said first data signal and said second data signal, comparing said first and second data signal, and generating a signal, said signal indicating the result of said comparison;

wherein the write qualification unit suppresses the bit-wise conditional write operation if the signal is deasserted.

5. The write qualification unit of claim 1, wherein the predetermined logical relationship between the first data signal and the second data signal is the first data signal being different from the second data signal.

6. The write qualification unit of claim 1, wherein the predetermined logical relationship between the first data signal and the second data signal is the first data signal being equal to the second data signal.

7. A write qualification unit, coupled to a sense amplifier and a memory array, said write qualification unit controlling the write operation to a cell in said memory array, said write qualification unit comprising:

a first input coupled to a first bitline to receive a first signal from the sense amplifier, a second input coupled to a second bitline to receive a second signal from said sense amplifier, said second signal being a logical complement of the first signal, and a third input for receiving data to be written to said cell, said write qualification unit conditioning a write to said cell based on the state of the first signal, the second signal, and the data to be written.

8. The write qualification unit of claim 7, wherein said write qualification unit selectively generates a first output signal and a second output signal directed toward said cell in response to one of a comparison between the first signal and the data to be written and the second signal and the data to be written.

9. The write qualification unit of claim 8, wherein the write qualification unit further includes a compare unit that selectively compares the first signal with the data to be written to and the second signal with the data to be written to said cell and selectively performs one of driving the voltage of the first and second output to values corresponding to the data to be written, and leaving the voltage on the first and second outputs intact.

10. A method for performing a bit-wise conditional write operation on a memory, said memory having a plurality of memory locations, said write operation directed to a target memory location, said write operations for writing a write signal to the target memory, said method comprising the steps of:

a) reading a first data signal from the target memory location; and b) performing a bit-wise conditional write operation of the write data signal on the first data signal wherein only the bits in the target memory location that are different from the first data signal.

11. The method of performing a write operation of claim 10, further comprising the step of suppressing the write operation if the first data signal is the same as the second data signal.

12. The method of performing a write operation of claim 10, wherein the step of writing is further conditioned on receiving a write enable signal, wherein said write operation occurs only if said write enable signal is active.

* * * * *